United States Patent
Gu et al.

(10) Patent No.: US 11,784,200 B2
(45) Date of Patent: Oct. 10, 2023

(54) IMAGE SENSING DEVICE HAVING MULTIPLE TRANSFER GATE STRUCTURE

(71) Applicant: SK hynix Inc., Icheon-si (KR)

(72) Inventors: Tae Lim Gu, Icheon-si (KR); Yun Hui Yang, Cheongju-si (KR)

(73) Assignee: SK HYNIX INC., Icheon-si (KR)

(*) Notice: Subject to any disclaimer, the term of this patent is extended or adjusted under 35 U.S.C. 154(b) by 123 days.

(21) Appl. No.: 16/597,572

(22) Filed: Oct. 9, 2019

(65) Prior Publication Data
US 2021/0005652 A1  Jan. 7, 2021

(30) Foreign Application Priority Data
Jul. 2, 2019 (KR) .......................... 10-2019-0079333

(51) Int. Cl.
 *H01L 27/146* (2006.01)
 *H01L 27/148* (2006.01)
(52) U.S. Cl.
 CPC .. *H01L 27/14616* (2013.01); *H01L 27/14603* (2013.01); *H01L 27/14614* (2013.01); *H01L 27/14641* (2013.01); *H01L 27/14643* (2013.01); *H01L 27/14856* (2013.01)
(58) Field of Classification Search
 CPC ......... H01L 27/14643; H01L 27/14641; H01L 27/14614; H01L 27/14603; H01L 27/1461; H01L 27/14605; H01L 27/14607; H01L 27/146; H01L 27/14601; H01L 27/14806; H01L 27/14812
 USPC ................ 257/291, 292, E27.131, E27.133, 257/E27.151, E27.152; 438/60, 75, 259
 See application file for complete search history.

(56) References Cited

U.S. PATENT DOCUMENTS

| | | | |
|---|---|---|---|
| 2004/0218078 A1* | 11/2004 | Lee | H01L 27/14609 348/308 |
| 2006/0081887 A1* | 4/2006 | Lyu | H01L 27/14609 257/215 |

(Continued)

FOREIGN PATENT DOCUMENTS

| | | |
|---|---|---|
| CN | 103972258 A | 8/2014 |
| CN | 104617116 A | 5/2015 |

(Continued)

OTHER PUBLICATIONS

Office Action dated Oct. 27, 2022 in Chinese Patent Application No. 201911015336.4, 17 pages, with English translation.

*Primary Examiner* — David Chen
(74) *Attorney, Agent, or Firm* — Perkins Coie LLP

(57) ABSTRACT

An image sensing device includes a photoelectric conversion element configured to generate photocharges in response to incident light, a floating diffusion configured to temporarily store the photocharges generated by the photoelectric conversion element, and a transfer gate configured to transmit the photocharges generated by the photoelectric conversion element to the floating diffusion region. The transfer gate includes a main transfer gate disposed to overlap a center section of the photoelectric conversion element and configured to operate in response to a first transmission signal, and a sub transfer gate disposed to overlap a boundary region of the photoelectric conversion element and configured to operate in response to a second potential level different from the first potential level.

21 Claims, 4 Drawing Sheets

(56) References Cited

U.S. PATENT DOCUMENTS

| | | | |
|---|---|---|---|
| 2006/0138581 A1* | 6/2006 | Ladd | H01L 27/1463 257/E27.132 |
| 2009/0284731 A1* | 11/2009 | Jin | H01L 27/14609 356/4.01 |
| 2009/0303371 A1* | 12/2009 | Watanabe | H01L 27/14641 348/311 |
| 2009/0322919 A1* | 12/2009 | Itonaga | H01L 27/14612 348/294 |
| 2010/0289935 A1* | 11/2010 | Ohno | H01L 27/14612 257/E31.097 |
| 2011/0019063 A1* | 1/2011 | Watanabe | H01L 27/14689 348/340 |
| 2012/0187279 A1* | 7/2012 | Kim | H04N 5/3559 250/208.1 |
| 2014/0217474 A1* | 8/2014 | Lee | H01L 27/14641 257/225 |
| 2016/0268322 A1 | 9/2016 | Watanabe et al. | |
| 2019/0115388 A1* | 4/2019 | Jung | H01L 27/1464 |

FOREIGN PATENT DOCUMENTS

| | | |
|---|---|---|
| CN | 104867949 A | 8/2015 |
| CN | 104900663 A | 9/2015 |
| CN | 109786403 A | 5/2019 |
| KR | 10-0891123 | 4/2009 |
| KR | 10-2009-0127828 | 12/2009 |

\* cited by examiner

US 11,784,200 B2

IMAGE SENSING DEVICE HAVING MULTIPLE TRANSFER GATE STRUCTURE

CROSS-REFERENCE TO RELATED APPLICATION

This patent document claims the priority and benefits to Korean patent application No. 10-2019-0079333 filed on Jul. 2, 2019, which is hereby incorporated in its entirety by reference.

TECHNICAL FIELD

The technology and implementations disclosed in this patent document generally relate to an image sensing device.

BACKGROUND

An image sensing device is a semiconductor device that converts an optical image into electrical signals. With the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

SUMMARY

Various implementations of the disclosed technology are directed to an image sensing device.

Some implementations of the disclosed technology relate to an image sensing device for solving problems of a potential pocket by improving a gate structure of a transmission (Tx) transistor (or a transfer (Tx) transistor).

In accordance with an embodiment of the disclosed technology, an image sensing device may include a photoelectric conversion element configured to generate photocharges in response to incident light, a floating diffusion region located in the vicinity of the photoelectric conversion element and configured to temporarily store the photocharges generated by the photoelectric conversion element, and a transfer gate disposed to overlap with the photoelectric conversion element and configured to transmit the photocharges generated by the photoelectric conversion element to the floating diffusion region. The transfer gate includes a main transfer gate disposed to overlap a center section of the photoelectric conversion element, and configured to operate in response to a first potential level, and a sub transfer gate located apart from the main transfer gate and disposed to overlap a boundary region of the photoelectric conversion element and configured to operate in response to a second potential level different from the first potential level.

In accordance with another embodiment of the disclosed technology, an image sensing device may include first to fourth photoelectric conversion elements configured to generate photocharges in response to incident light, a floating diffusion region shared by the first to fourth photoelectric conversion elements and configured to temporarily store the photocharges generated by the first to fourth photoelectric conversion elements, and first to fourth transfer gates disposed to overlap with the first to the fourth photoelectric conversion elements, respectively. Each of the first to fourth transfer gates includes a main transfer gate disposed to overlap a center part of a corresponding photoelectric conversion element, and configured to transmit the photocharges generated by the corresponding photoelectric conversion element to the floating diffusion region in response to a first signal, and a sub transfer gate disposed to overlap a boundary region of a corresponding photoelectric conversion element, and configured to transmit the photocharges generated by the corresponding photoelectric conversion element to the floating diffusion region in response to a second signal different in magnitude from the first signal.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description and the accompanying drawings.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
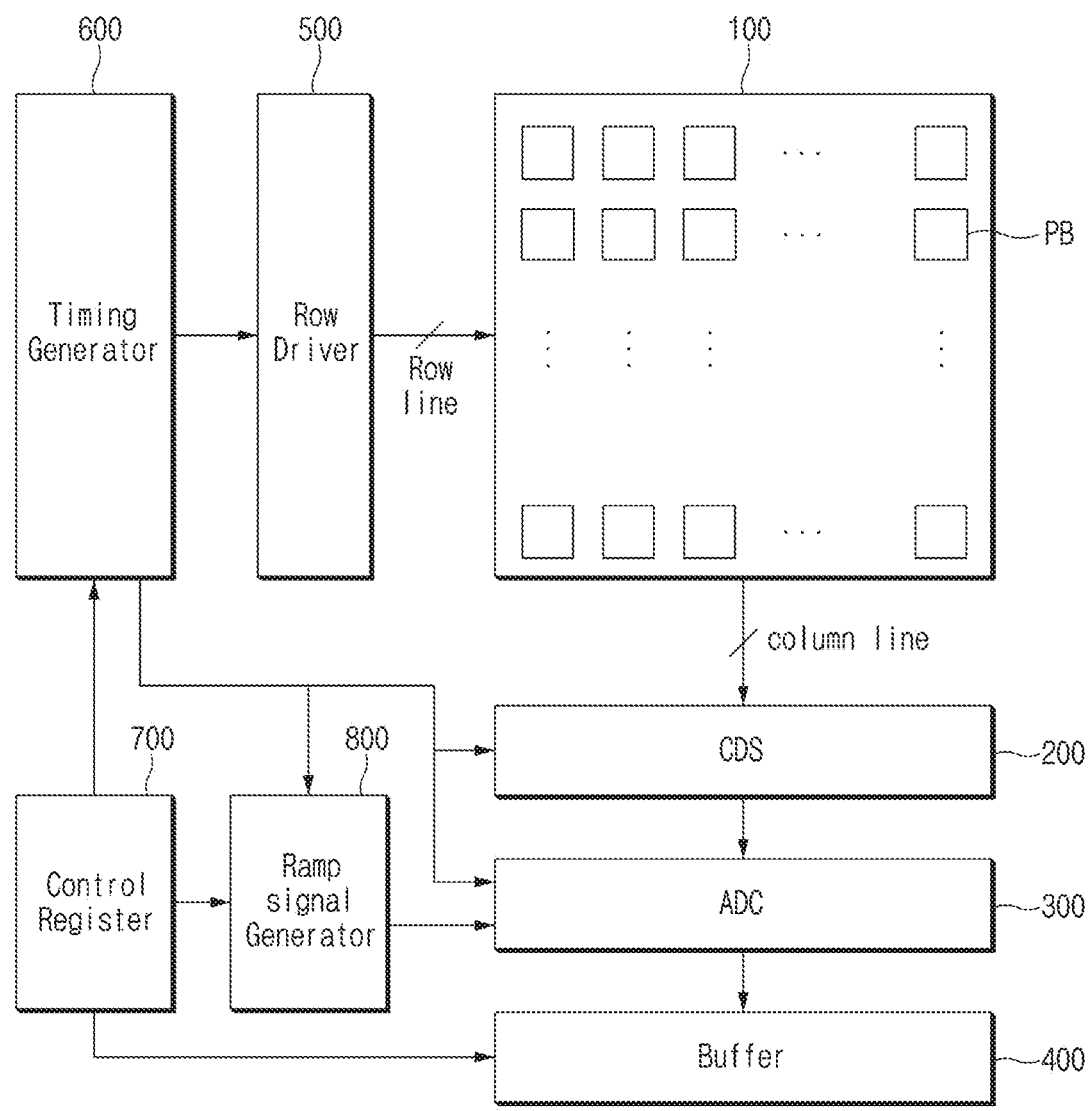
FIG. 1 is an example of a block diagram illustrating an image sensing device based on one implementation of the disclosed technology.

FIG. 1 is a block diagram illustrating an image sensing device based on one implementation of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a matrix shape. Each pixel block (PB) may include a plurality of unit pixels (PXs) configured to share a floating diffusion (FD) region and some pixel transistors with each other. For example, the pixel block (PB) may be formed as a shared pixel structure in which four unit pixels (PXs) share a floating diffusion (FD) region, a reset transistor, a source follower transistor, and a selection transistor. Each of the unit pixels (PXs) may include a photoelectric conversion element for generating photocharges through conversion of an incident optical signal received from the outside, and a transmission (Tx) transistor for transmitting photocharges generated from the photoelectric conversion element to the floating diffusion (FD) region. In this case, each transmission (Tx) transistor may be comprised of a multiple transfer gate structure including a plurality of transfer gates. A detailed description of the above-mentioned pixel block (PB) will hereinafter be given. The pixel block (PB) may output a pixel signal indicating electrical image signals of the unit pixels to the correlated double sampler (CDS) 200 through column lines. The pixel blocks (PBs) may be coupled to row lines and column lines.

The correlated double sampler (CDS) 200, which is communicatively coupled to the pixel array 100 and the timing generator 600, may hold and sample the pixel signals received from the pixel blocks (PBs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300, which is communicatively coupled to the CDS 200 and the timing generator 600, may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400, which is communicatively coupled to the ADC 300, may store each of the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500, which is communicatively coupled to the pixel array 100 and the timing generator 600, may drive pixel blocks of the pixel array 100 in response to an output signal of the timing generator 600. For example, the row driver 500 may generate a control signal capable of selecting at least one of the plurality of row lines. The control signal may include a selection signal for controlling the selection transistor and a transmission (Tx) signal for controlling multiple transfer gates to be described later.

The timing generator 600, which is communicatively coupled to the row driver 500, the correlated double sampler (CDS) 200, the analog-to-digital converter (ADC) 300, and the ramp signal generator 800, may generate a timing signal to control the row driver 500, the correlated double sampler (CDS) 200, the analog-to-digital converter (ADC) 300, and the ramp signal generator 800.

The control register 700, which is communicatively coupled to the ramp signal generator 800, the timing generator 600, and the buffer 400, may generate control signals to control the ramp signal generator 800, the timing generator 600, and the buffer 400.

The ramp signal generator 800, which is communicatively coupled to the buffer 600 and the timing generator 600, may generate a ramp signal to control an image signal received from the buffer 400 in response to a control signal received from the timing generator 600.

Figure 2:
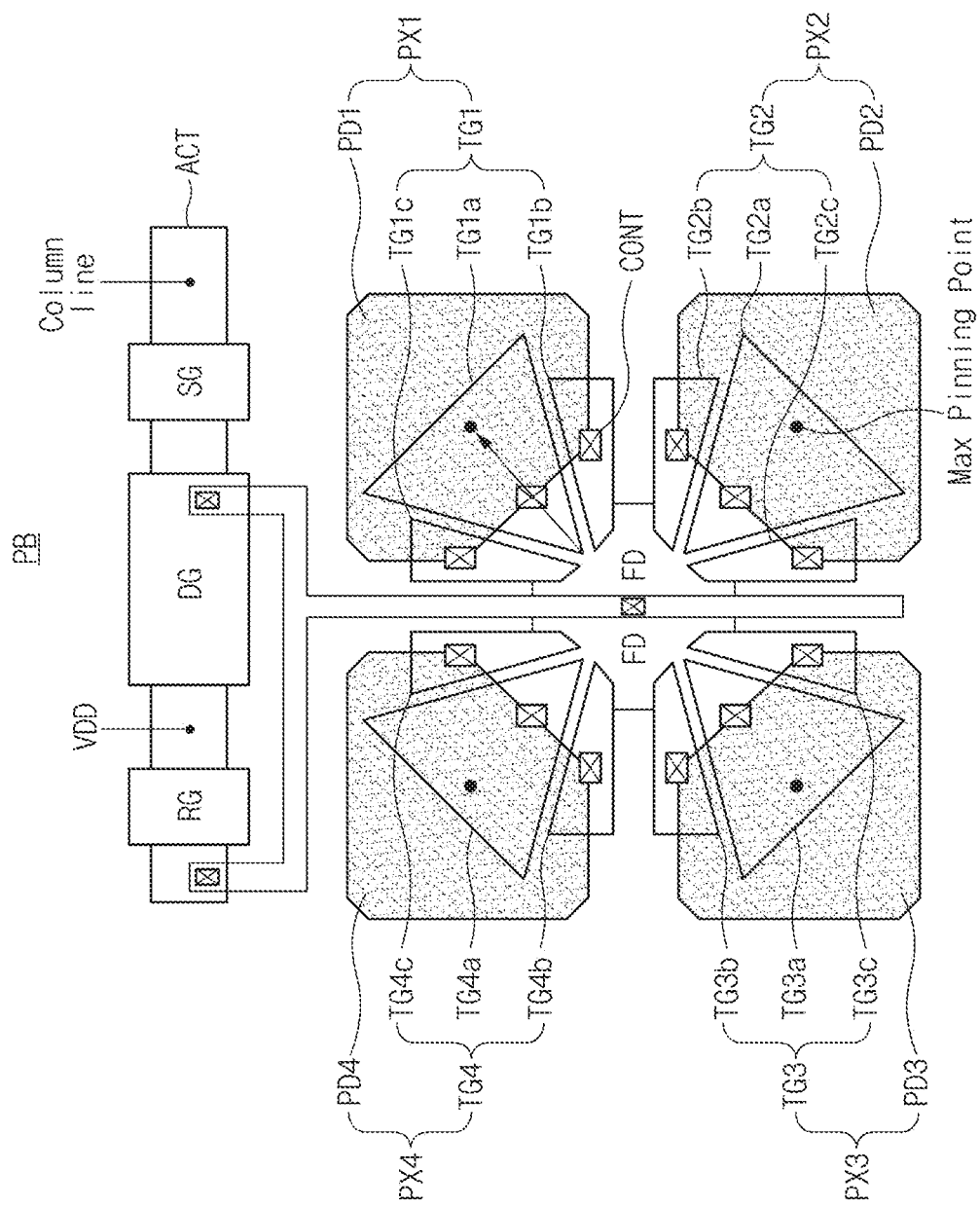
FIG. 2 is an example of a schematic diagram illustrating pixel blocks formed in a pixel array shown in FIG. 1 based on the disclosed technology.
Figure 3:
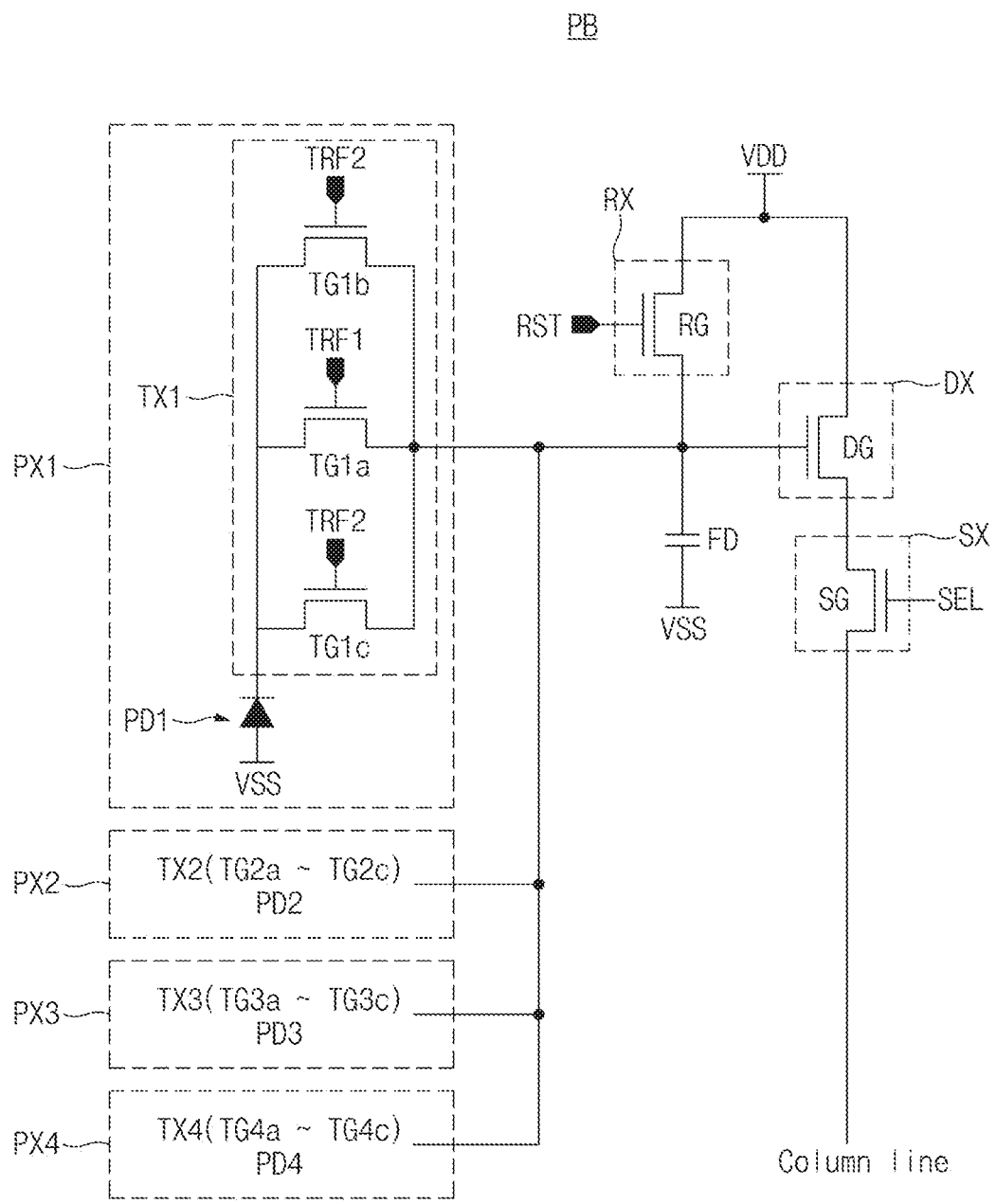
FIG. 3 is an example of an equivalent circuit diagram illustrating pixel blocks shown in FIG. 2 based on the disclosed technology.

FIG. 2 is an example of a schematic diagram illustrating pixel blocks (PBs) formed in a pixel array 100 shown in FIG. 1 based on the disclosed technology. FIG. 3 is an equivalent circuit diagram illustrating each of pixel blocks (PBs) shown in FIG. 2 based on the disclosed technology.

Although FIG. 3 illustrates the circuit of only one unit pixel PX1 among four unit pixels PX1 to PX4 contained in each pixel block PB, the remaining pixels PX2 to PX4 can be represented by a similar circuit structure. For convenience of description, the circuit as shown in FIG. 2 will be explained with regard to the unit pixel PX1 and a detailed description of the remaining unit pixels PX2 to PX4 will be omitted.

Referring to FIGS. 2 and 3, each pixel block PB may include a plurality of unit pixels PX1 to PX4, a floating diffusion (FD) region shared by the unit pixels PX1 to PX4, and drive transistors. For example, each pixel block PB may be formed as a shared pixel structure in which four unit pixels PX1 to PX4 share the floating diffusion (FD) region and the drive transistors.

The unit pixels PX1 to PX4 may respectively include photoelectric conversion elements PD1 to PD4, and may also respectively include transmission transistors TX1 to TX4 for transmitting photocharges generated from the photoelectric conversion elements PD1 to PD4 to the floating diffusion (FD) region.

Each of the photoelectric conversion elements PD1 to PD4 may include an organic or inorganic photosensing element, for example, a photodiode, a photogate, a phototransistor, a photoconductor, or some other photosensing structures capable of generating photocharges. For example, the photoelectric conversion elements PD1 to PD4 may be formed in a lower region (or a lower portion) of the substrate, and may include a stacked structure in which impurity regions (i.e., P-type impurity region and N-type impurity region) having complementary conductivities are vertically stacked.

The floating diffusion (FD) region may be formed in an upper region of the substrate, and may temporarily store photocharges generated by the photoelectric conversion elements and received through the transmission transistors TX1 to TX4. The floating diffusion (FD) region may be located around or at the center region between the unit pixels PX1 to PX4 so that the floating diffusion (FD) region can be surrounded by the unit pixels PX1 to PX4.

The transmission transistors TX1 to TX4 may include transfer gates TG1 to TG4, respectively. The transfer gates TG1 to TG4 may be coupled to the photoelectric conversion elements PD1 to PD4 and the floating diffusion (FD) region, respectively. In some implementations, the transmission transistor TX1 may allow the photoelectric conversion element PD1 and the floating diffusion (FD) region to be respectively used as a source and a drain. The transmission transistor TX2 may allow the photoelectric conversion element PD2 and the floating diffusion (FD) region to be respectively used as a source and a drain. The transmission transistor TX3 may allow the photoelectric conversion element PD3 and the floating diffusion (FD) region to be respectively used as a source and a drain. The transmission transistor TX4 may allow the photoelectric conversion element PD4 and the floating diffusion (FD) region to be respectively used as a source and a drain. In addition, the transmission transistors TX1 to TX4 may transmit photocharges generated by the photoelectric conversion elements PD1 to PD4 to the floating diffusion (FD) region in response to transmission signals TRF1 and TRF2 applied to the transfer gates TG1 to TG4.

Referring to FIG. 2, each of the transfer gates TG1 to TG4 may be formed as a multiple transfer gate structure including a plurality of transfer gates coupled in parallel between the floating diffusion (FD) region and a corresponding one of the photoelectric conversion elements PD1 to PD4.

For example, the transfer gate TG1 of the unit pixel PX1 may include a plurality of gates TG1a to TG1c coupled in parallel between the floating diffusion (FD) region and the photoelectric conversion element PD1.

In some implementations, the plurality of gates TG1a to TG1c may include a main transfer gate TG1a and sub transfer gates TG1b and TG1c.

The main transfer gate TG1a may be located at the center of the transfer gate TG1 such that the main transfer gate TG1a is arranged between the sub transfer gates TG1b and TG1c. The main transfer gate TG1a may have an area larger than the sub transfer gates TG1b and TG1c. The main transfer gate TG1a and the sub transfer gates TG1b and TG1c may be arranged to overlap with the photoelectric conversion element PD1. In this case, the main transfer gate TG1a may have the largest overlapping area with the photoelectric conversion element PD1 as compared to the sub transfer gates TG1b and TG1c. In some implementations, the main transfer gate TG1a may be elongated in a longitudinal direction in a manner that the main transfer gate TG1a can overlap with a maximum (Max) pinning point (or maximum capacitance point) where the photoelectric conversion element PD1 has the highest capacitance. In some implementations, the maximum pinning point (or maximum capacitance point) is around the center of the photoelectric conversion element PD1. In this case, the longitudinal direction may denote the radial direction from the floating diffusion FD region to the photoelectric conversion element PD as shown in an arrow direction of FIG. 2. In a plan view, the main transfer gate TG1a may have a triangular shape in which one vertex region overlaps with the floating diffusion (FD) region and two vertex regions overlap with the photoelectric conversion element PD1.

The sub transfer gates TG1b and TG1c may be respectively located at both sides of the main transfer gate TG1a, and may overlap with other regions (e.g., around boundary regions) of the photoelectric conversion element PD1 that are located at sides of the region where the main transfer gate TG1a overlaps with the photoelectric conversion element PD1. The sub transfer gates TG1b and TG1c may be formed symmetrical to each other with reference to the main transfer gate TG1a. The longitudinal size of each of the sub transfer gates TG1b and TG1c may be shorter than the longitudinal size of the main transfer gate TG1a.

The main transfer gate TG1a and the sub transfer gates TG1b and TG1c may be coupled to metal lines (not shown) for transmitting transmission signals TRF1 and TRF2 through a contact CONT. In this case, the contact CONT may be coupled to top surfaces of the transfer gates TG1a, TG1b, and TG1c, and may be formed to overlap with the boundary region of the photoelectric conversion element PD1.

The multiple transfer gate structure in which the transfer gate TG1 of the transmission transistor TX1 includes multiple gates TG1a, TG1b, and TG1c can allow the different transmission signals to be applied to the photoelectric conversion element PD1. Thus, as compared to the case in which the transfer gate TG1 of the transmission transistor TX1 is formed as a single gate, different transmission signals with different magnitudes (different potential levels) can be applied to the respective positions of the same photoelectric conversion element PD1 through the multiple gates TG1a, TG1b, and TG1c.

Thus, according to embodiments of the disclosed technology, different magnitudes (different potential levels) of transmission signals TRF1 and TRF2 can be applied to the main transfer gate TG1a and the sub transfer gates TG1b and TG1c. In this case, the main transfer gate TG1a may receive the transmission signal TRF1 having a relatively high voltage, and each of the sub transfer gates TG1b and TG1c may receive the other transmission signal TRF2 having a relatively low voltage (where TRF1>TRF2). The benefits obtained from using the transmission signals with different magnitudes will be explained later in this document.

For example, a voltage of about 3.4V used as the transmission signal TRF1 may be applied to the main transfer gate TG1a, and a voltage of about 3.0V used as the transmission signal TRF2 may be applied to each of the sub transfer gates TG1b and TG1c. In some implementations, transmission signals of the same magnitude are applied to each of the sub transfer gates TG1b and TG1c. In some other implementations, transmission signals with different magnitudes can be applied to the sub transfer gates TG1b and TG1c.

The transfer gates TG2, TG3, and TG4 can employ the multiple transfer structure discussed above for the transfer gate TG1. Thus, the transfer gate TG2 of the unit pixel PX2 may include a plurality of gates TG2a to TG2c coupled in parallel between the floating diffusion (FD) region and the photoelectric conversion element PD2, the transfer gate TG3 of the unit pixel PX3 may include a plurality of gates TG3a to TG3c coupled in parallel between the floating diffusion (FD) region and the photoelectric conversion element PD3. In addition, the transfer gate TG4 of the unit pixel PX3 may include a plurality of gates TG4a to TG4c coupled in parallel between the floating diffusion (FD) region and the photoelectric conversion element PD4.

In some implementations, each of the transfer gates TG1 to TG4 may be formed as a vertical gate in which a vertical channel is formed. Alternatively, each of the transfer gates TG1 to TG4 may be formed as a planar gate over the substrate.

Drive transistors shared by the unit pixels PX1 to PX4 may include a reset transistor RX, a drive transistor DX acting as a source follower transistor, and a selection transistor SX.

The reset transistor RX, the drive transistor DX, and the selection transistor SX may share a single active region ACT. The reset transistor RX may include a reset gate RG, the drive transistor DX may include a drive gate DG, and the selection transistor SX may include a selection gate SG.

The drive gate DG may be located at the center of the active region ACT. The reset gate RG and the selection gate SG may be respectively located at both sides of the drive gate DG. A junction region (source and drain regions) may be formed in the active region ACT. The active region may be located at both sides of the reset gate RG, the drive gate DG, and the selection gate SG.

The reset transistor RX may be coupled between the floating diffusion (FD) region and a power-supply voltage (VDD) terminal. The reset transistor RX may initialize the floating diffusion (FD) region in response to a reset signal RST applied to the reset gate RG. The active region ACT located at one side of the reset gate RG may be coupled to the floating diffusion (FD) region through the metal line, and the other active region ACT located at the other side of the reset gate RG may be coupled to the power-supply voltage (VDD) terminal through the metal line.

The drive transistor DX may be coupled between the power-supply voltage (VDD) terminal and the selection transistor SX. The drive gate DG may be coupled to the floating diffusion (FD) region through the metal line. The drive transistor DX may generate an output signal corresponding to the amount of photocharges stored in the floating diffusion (FD) region, and may output the generated output signal to the selection transistor SX.

The selection transistor SX may be coupled between the drive transistor DX and the column line, and may transmit an output signal generated by the drive transistor DX to the column line in response to a selection signal SEL applied to the selection gate SG.

Figure 4A:
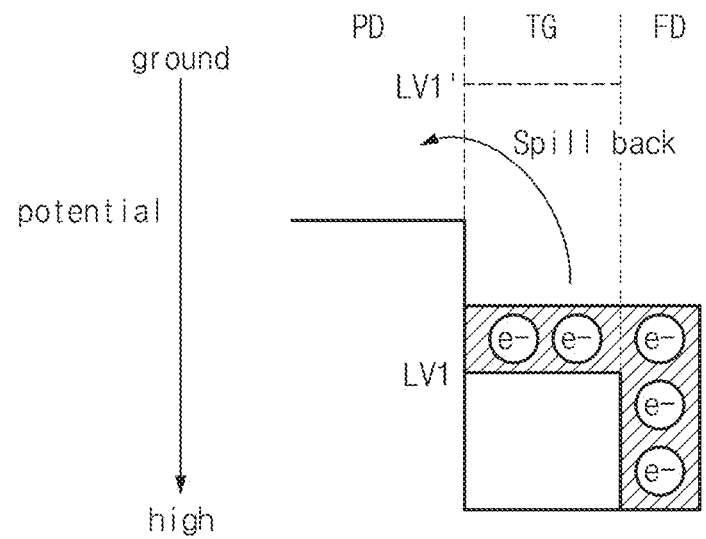
FIG. 4A is a potential profile illustrating problems caused by residual photocharges in a potential pocket at a lower part of a transfer gate based on the related art.
Figure 4B:
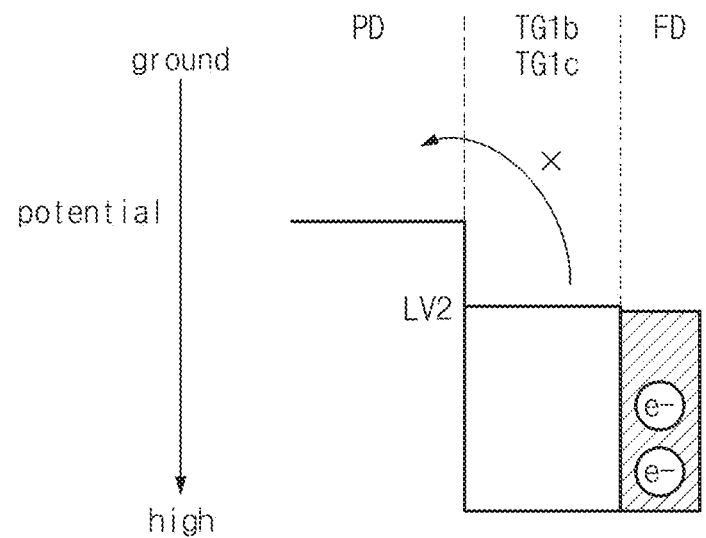
FIG. 4B is a potential profile used in sub transfer gates shown in FIG. 2 based on the disclosed technology.

FIG. 4A shows a potential profile in a comparative example of a transfer gate formed as a single structure. The potential profile shown in FIG. 4A illustrates problems caused by residual photocharges in a potential pocket formed below a transfer gate in the related art. FIG. 4B shows a potential profile generated in the sub transfer gates TG1b and TG1c shown in FIG. 2 based on the disclosed technology.

Referring to FIG. 4A, when an input with a potential of LV1 is applied to turn on the transfer gate of the image sensing device a potential pocket may be formed in a connection part between the photoelectric conversion element PD and the channel region of the transfer gate. The potential pocket may indicate a region where some photocharges generated from the photoelectric conversion element PD are accumulated without being transmitted to the floating diffusion (FD) region. Thus, some of photocharges generated from the photoelectric conversion element may be kept in the potential pocket formed below the transfer gate.

If the transmission transistor is turned off when photocharges are accumulated in the potential pocket, a potential level of the transfer gate is lowered (i.e., the position of LV1 moves upward to the position of LV1' as shown in FIG. 4A), so that all or some of the photocharges accumulated in the potential pocket may be re-injected or moved back into the photoelectric conversion element PD, resulting in an occurrence of a spill-back phenomenon. The potential pocket causes a number of problems (e.g., noise and signal delay). Those problems caused by the potential pocket may become more severe in proportion to the increase of a potential level that is applied to the transfer gate to turn on the transfer transistor.

Due to the problems caused by the potential pocket, it is difficult to increase the potential level applied to the transfer gate although there are some situations which require to increase the potential level.

The embodiments of the disclosed technology, among other features and benefits, configure the transfer gate with multiple gates and allow different potential levels to be applied to the multiple gates. In addition, some implementations of the disclosed technology provide ways to apply different potential levels to the multiple gates while minimizing or avoiding issues caused by the potential pocket.

As briefly mentioned above, the maximum pinning point where the photoelectric conversion element PD has the highest capacitance may be formed around the center of the photoelectric conversion element PD1. Thus, the closer the transfer gate TG is to the center of the photoelectric conversion element PD, the higher the transmission efficiency of the transfer gate TG can be obtained.

Therefore, as can be seen from the pixel block PB shown in FIG. 2, each transfer gate TG1, TG2, TG3, or TG4 may be divided into or include multiple gates, TG1a to TG1c, TG2a to TG2c, TG3a to TG3c, or TG4a to TG4c. The multiple gates are located on different positions of the corresponding photoelectric conversion element PD1, PD2, PD3, or PD4 such that each of the multiple gates overlap with different parts of the corresponding photoelectric conversion element PD1, PD2, PD3, or PD4. The multiple gates may have different sizes and potentials having different levels can be applied to at least some of the multiple gates.

For example, the transfer gate TG1 may include a main transfer gate TG1a overlapped with the center part of the photoelectric conversion element PD1 and the sub transfer gates TG1b and TG1c overlapped with the boundary region of the photoelectric conversion element PD1.

The main transfer gate TG1a may be elongated in the longitudinal direction so that the main transfer gate TG1a can overlap with the maximum pinning point of the photoelectric conversion element PD1. The sub transfer gates TG1b and TG1c may be formed to overlap the boundary region of the photoelectric conversion element PD1 at both sides of the main transfer gate TG1a.

In some implementations, the main transfer gate TG1a and the sub transfer gates TG1b and TG1c may be formed in a manner that most of the region where the potential pocket is formed can be located below the sub transfer gates TG1b and TG1c.

FIG. 4B shows an implementation of the disclosed technology where a potential (i.e., transmission signal TRF2) having a level LV2 lower than the potential level LV1 shown in FIG. 4A is applied to each of the sub transfer gates TG1b and TG1c. In this case, since the potential level applied to each of the sub transfer gates TG1b and TG1c becomes less than the comparative example as shown in FIG. 4A, the issue caused by the potential pocket can be reduced or eliminated. In some implementations, the potential level applied to each of the sub transfer gates TG1b and TG1c can be determined such that residual charges caused by the potential pocket do not occur below the sub transfer gates TG1b and TG1c.

Although not shown, a potential having a level LV3 higher than the potential level LV2 applied to each of the sub transfer gates TG1b and TG1c may be applied to the main transfer gate TG1a. In some implementations, the potential level LV3 applied to the main transfer gate TG1a may be higher than the potential level LV1 as necessary.

As described above, although the potential level of the main transfer gate TG1a is high, the potential pocket formed in the main transfer gate TG1a among the entire transfer gate TG1 is considered not large in size. Accordingly, even when the potential level of the main transfer gate TG1a gradually increases, the problem caused by the potential pocket can be small compared to the case when the higher potential level is applied to the entire transfer gate. Thus, noise and signal delay caused by the potential pocket can be reduced even when applying the high potential level to the main transfer gate TG1a.

In some implementations, since the main transfer gate TG1a is formed to overlap the highest-capacitance point of the photoelectric conversion element PD, the amount of photocharges transferred from the photoelectric conversion element PD to the floating diffusion region can be increased through the main transfer gate TG1a. Thus, although the amount of photocharges kept below the main transfer gate TG1a slightly increases due to the increasing potential level of the main transfer gate TG1a, the total amount of photocharges to be transferred to the floating diffusion region can be increased. Therefore, by applying the potential level to the main transfer gate TG1a based on the capacitance (Max Pinning) of the photoelectric conversion element PD is applied, the problems caused by the potential pocket can be reduced or avoided despite the increasing potential level of the main transfer gate TG1a.

As is apparent from the above description, the image sensing device based on the implementations of the disclosed technology can reduce noise and signal delay caused by a potential pocket.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
   one photoelectric conversion element configured to generate photocharges in response to incident light;
   one floating diffusion region located in a vicinity of the one photoelectric conversion element and configured to temporarily store the photocharges generated by the one photoelectric conversion element; and
   a transfer gate disposed to overlap with the one photoelectric conversion element and configured to transmit the photocharges generated by the one photoelectric conversion element to the one floating diffusion region,
   wherein the transfer gate includes:
      a first transfer gate disposed to overlap a center section of the one photoelectric conversion element, and configured to operate in response to a first potential level;
      a second transfer gate located at one side of the first transfer gate; and
      a third transfer gate located at another side of the first transfer gate,
   wherein the second transfer gate and the third transfer gate are disposed to overlap a boundary region of the one photoelectric conversion element and configured to operate in response to a second potential level different from the first potential level,
   wherein the first transfer gate, the second transfer gate, and the third transfer gate overlap different portions of the one photoelectric conversion element that is located at a certain level within a substrate, and
   wherein a first portion of the one photoelectric conversion element that overlaps the first transfer gate is greater than a second portion and a third portion of the one photoelectric conversion element that overlap the second transfer gate and the third transfer gate, respectively, and
   wherein each of the first transfer gate, the second transfer gate, and the third transfer gate overlaps the one floating diffusion region.

2. The image sensing device according to claim 1, wherein the first potential level has a higher potential level than the second potential level.

3. The image sensing device according to claim 1, wherein the first transfer gate is positioned to overlap a maximum capacitance point of the one photoelectric conversion element.

4. The image sensing device according to claim 1, wherein the second transfer gate and the third transfer gate are arranged symmetrical with respect to the first transfer gate.

5. The image sensing device according to claim 1, wherein each of the second transfer gate and the third transfer gate operates based on a different potential level.

6. The image sensing device according to claim 1, wherein each of the second transfer gate and the third transfer gate operates based on a same potential level.

7. The image sensing device according to claim 1, wherein the second and third transfer gates partly overlap with the one photoelectric conversion element and partly overlap with the one floating diffusion region.

8. The image sensing device according to claim 1, further comprising:
   contacts disposed at top surfaces of the first transfer gate, the second transfer gate, and the third transfer gate,
   wherein the contacts overlap the boundary region of the one photoelectric conversion element.

9. An image sensing device comprising:
   one photoelectric conversion element configured to generate photocharges in response to incident light;
   one floating diffusion region located in a vicinity of the one photoelectric conversion element and configured to temporarily store the photocharges generated by the one photoelectric conversion element; and
   a transfer gate disposed to overlap with the one photoelectric conversion element and configured to transmit the photocharges generated by the one photoelectric conversion element to the one floating diffusion region,
   wherein the transfer gate includes:
      a first transfer gate disposed to overlap a center section of the one photoelectric conversion element, and configured to operate in response to a first potential level;
      a second transfer gate located at one side of the first transfer gate; and
      a third transfer gate located at another side of the first transfer gate,
   wherein the second transfer gate and the third transfer gate are disposed to overlap a boundary region of the one photoelectric conversion element and configured to operate in response to a second potential level different from the first potential level, and wherein the first transfer gate has a triangular shape and wherein a first vertex region of the triangular shape overlaps the one floating diffusion region and a second and a third vertex regions of the triangular shape overlap with the one photoelectric conversion element.

10. The image sensing device according to claim 9, wherein each of the second transfer gate and the third transfer gate operates based on a different potential level.

11. The image sensing device according to claim 9, wherein each of the second transfer gate and the third transfer gate operates based on a same potential level.

12. The image sensing device according to claim 9, further comprising:
   contacts disposed at top surfaces of the first transfer gate, the second transfer gate, and the third transfer gate,
   wherein the contacts overlap the boundary region of the one photoelectric conversion element.

13. An image sensing device comprising:
   first to fourth photoelectric conversion elements configured to generate photocharges in response to incident light;

a floating diffusion region shared by the first to fourth photoelectric conversion elements, and configured to temporarily store the photocharges generated by the first to fourth photoelectric conversion elements; and first to fourth transfer gates disposed to overlap with the first to fourth photoelectric conversion elements, respectively, wherein each of the first to fourth transfer gates includes:

a first transfer gate disposed to overlap a center part of a corresponding photoelectric conversion element, and configured to transmit the photocharges generated by the corresponding photoelectric conversion element to the floating diffusion region in response to a first signal;

a second transfer gate located at one side of the first transfer gate; and a third transfer gate located at another side of the first transfer gate, wherein the second and third transfer gates disposed to overlap a boundary region of the corresponding photoelectric conversion element, and configured to transmit the photocharges generated by the corresponding photoelectric conversion element to the floating diffusion region in response to a second signal different in magnitude from the first signal.

14. The image sensing device according to claim 13, wherein the first signal has a higher potential level than the second signal.

15. The image sensing device according to claim 13, wherein the first transfer gate is disposed to overlap a maximum capacitance point of the corresponding photoelectric conversion element.

16. The image sensing device according to claim 13, wherein the second transfer gate and the third transfer gate are arranged symmetrical with respect to the first transfer gate.

17. The image sensing device according to claim 13, wherein the first transfer gate has a triangular shape such that a first vertex region of the triangular shape overlaps the floating diffusion region and a second and a third vertex regions of the triangular shape overlap with the corresponding photoelectric conversion element.

18. The image sensing device according to claim 13, wherein the second and third transfer gates partly overlap with the corresponding photoelectric conversion element and partly overlap with the floating diffusion region.

19. The image sensing device according to claim 13, wherein the first to fourth photoelectric conversion elements are a part of a pixel block of a pixel array having a plurality of pixel blocks.

20. The image sensing device according to claim 19, further comprising a driving circuitry communicatively coupled to the pixel array and configured to generate a control signal to drive the pixel array.

21. The image sensing device according to claim 20, further comprising a timing generator communicatively coupled to the driving circuitry and configured to generate a signal to control the driving circuitry.

* * * * *